US009578757B2

(12) United States Patent
Jacobs

(10) Patent No.: US 9,578,757 B2
(45) Date of Patent: Feb. 21, 2017

(54) SLIDABLE ENGAGEMENT OF ENCLOSURE HOUSINGS

(71) Applicant: HEWLETT-PACKARD DEVELOPMENT COMPANY, L.P., Houston, TX (US)

(72) Inventor: Steven Kamins Jacobs, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 14/786,313

(22) PCT Filed: Jul. 18, 2013

(86) PCT No.: PCT/US2013/051052
§ 371 (c)(1),
(2) Date: Oct. 22, 2015

(87) PCT Pub. No.: WO2015/009304
PCT Pub. Date: Jan. 22, 2015

(65) Prior Publication Data

US 2016/0120042 A1 Apr. 28, 2016

(51) Int. Cl.
*H05K 5/00* (2006.01)
*G06F 1/18* (2006.01)
*G06F 1/16* (2006.01)

(52) U.S. Cl.
CPC ........... *H05K 5/0013* (2013.01); *G06F 1/1656* (2013.01); *G06F 1/181* (2013.01); *G06F 1/1626* (2013.01)

(58) Field of Classification Search
CPC ...... H05K 5/0013; H05K 5/0217; G06F 1/181
See application file for complete search history.

(56) References Cited

U.S. PATENT DOCUMENTS

| | | | | |
|---|---|---|---|---|
| 6,262,883 | B1 | 7/2001 | Kim | |
| 6,302,454 | B1 * | 10/2001 | Tsurumaru | H01M 2/1022 292/145 |
| 6,574,096 | B1 | 6/2003 | Difonzo et al. | |
| 8,322,801 | B2 | 12/2012 | Yang et al. | |
| 8,355,247 | B2 | 1/2013 | Senatori et al. | |
| 2008/0316694 | A1 | 12/2008 | Yang et al. | |
| 2010/0090568 | A1 | 4/2010 | Tang | |
| 2011/0194236 | A1 | 8/2011 | Lai et al. | |
| 2011/0255252 | A1 * | 10/2011 | Sloey | H04B 1/3816 361/752 |

(Continued)

FOREIGN PATENT DOCUMENTS

GB 2396486 A 6/2004

OTHER PUBLICATIONS

"HP Pavilion dm1z Review", < http://liliputing.com/2011/04/hp-pavilion-dm1z-review.html >, retreived on Jun. 11, 2013.

(Continued)

*Primary Examiner* — Daniel Rohrhoff
(74) *Attorney, Agent, or Firm* — Robert Sismilich

(57) ABSTRACT

An enclosure having a first and second housing. The housings are slidably engaged along a first axis to form the enclosure. In one example, a compressed resilient member urges the housings together.

15 Claims, 10 Drawing Sheets

(56) References Cited

U.S. PATENT DOCUMENTS

| | | | | |
|---|---|---|---|---|
| 2012/0027511 | A1* | 2/2012 | Wei | H05K 5/0013 403/381 |
| 2012/0257341 | A1 | 10/2012 | Wang et al. | |
| 2012/0326575 | A1* | 12/2012 | Hirota | G06F 1/1601 312/7.2 |
| 2014/0016996 | A1* | 1/2014 | Chung | H05K 5/0221 403/321 |
| 2015/0035416 | A1* | 2/2015 | Yang | H05K 5/0013 312/223.1 |
| 2015/0061475 | A1* | 3/2015 | Fairchild | H05K 5/0013 312/223.1 |
| 2015/0201505 | A1* | 7/2015 | Hu | H05K 5/0013 312/223.1 |

OTHER PUBLICATIONS

Sklavos, "HP dm1z: Taking Fusion on the Road", < http://www.anandtech.com/show/4187/hp-dm1z-taking-fusion-on-the-road/2 >, Feb. 21, 2011.

* cited by examiner

SLIDABLE ENGAGEMENT OF ENCLOSURE HOUSINGS

BACKGROUND

Screws, tabs, or snaps are typically used to secure the housings of electronic devices such as notebook computers, tablets, cell phones, and many other devices. Screws are the most robust method, but undesirably often use many tiny pieces that get individually assembled into the device, and they visually mar the surface through which they are applied. Tabs and snaps are typically hidden from view, but they are undesirably less strong, and provide limited shear resistance to a twisting motion, giving a less-than-solid, lower-quality feel to the product.

DETAILED DESCRIPTION

Figure 1A:
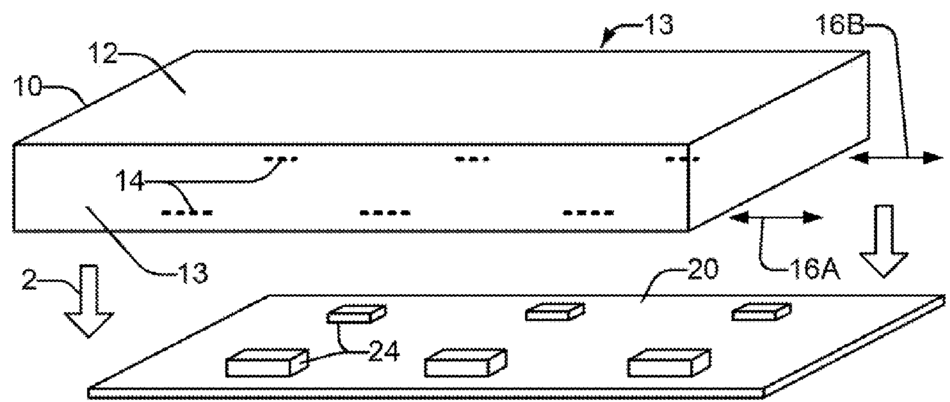
FIGS. 1A-1C are schematic representations of a drop-and-slide assembly method for an enclosure in accordance with an example of the present disclosure.

As noted in the Background section, many electronic as well as other products include housings that are assembled during manufacturing into an enclosure for various parts of the products. Such products may include notebook and desktop computers, cell phones, and many other examples. These products often include at least one enclosure that is generally box-like that encloses the internal components of the product. A desktop computer or a bar-style cell phone may have one such enclosure. A notebook computer or a flip-style cell phone may include two or more such enclosures; for example, one for the display and another base that houses the keyboard.

It is desirable to have the ability to quickly assemble the enclosure in manufacturing. In many cases it is also desirable to have the ability to quickly and easily disassemble the enclosures by separating the housings during servicing or repair, and then quickly and easily reassemble them when this work is complete to again form a robust mechanical structure that is resistant to a shearing or twisting motion. If the housings are attached using many tiny screws, this increases the manufacturing cost and time, and makes the service work more complicated and time-consuming.

In addition, many rectangular enclosures have two surfaces that are significantly larger than the other four surfaces. For example, in a notebook computer, these surfaces may be the keyboard deck and the bottom surface of the base. To ensure strength and rigidity, if screws are used they are attached through one of the larger surfaces, typically the bottom surface of the base enclosure. However, the screws or the screw holes are visible to the user, which is undesirable to the industrial design of many products.

Referring now to the drawings, there is illustrated an example of an enclosure and an enclosure attachment system constructed in accordance with the present disclosure in which a resilient member attached to a first housing is compressed during assembly by a rigid member attached to a second housing to urge the two larger surfaces toward each other when the housings are slidably engaged in a direction generally parallel to at least one of the larger surfaces. The housings are easily assembled to form a rigid enclosure resistant to shearing or twisting, without the use of screws or other fasteners in the two larger surfaces to mar their appearance.

Figure 1B:
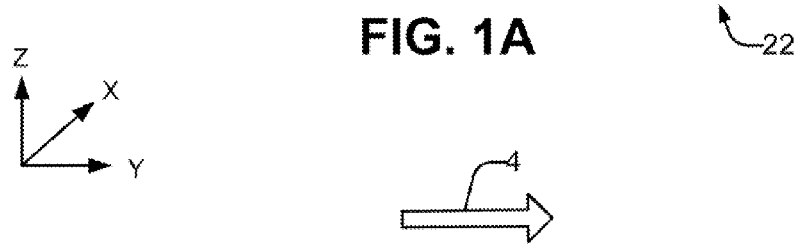
Figure 1C:
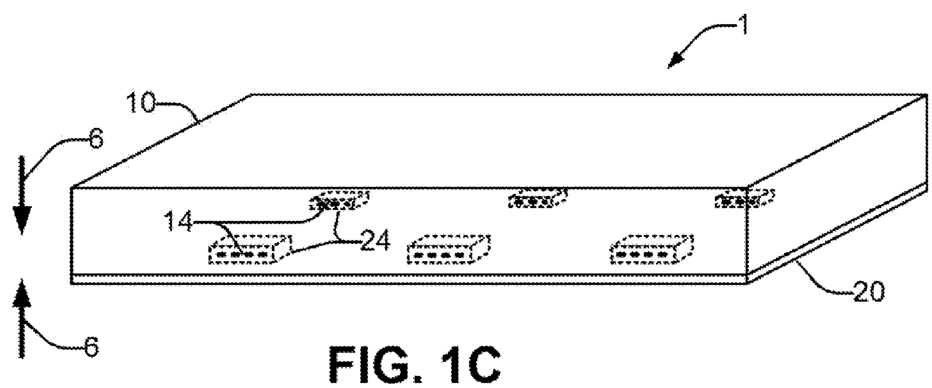

Considering now the assembly of an enclosure, and with reference to FIGS. 1A-1C, the enclosure 1 includes a first housing 10 and a second housing 20. The housings 10, 20 each have a large external surface 12, 22 respectively. The external surfaces 12, 22 are spaced apart, the void between them forming an interior of the enclosure. While the housings 10, 20 are illustrated as rectangular for simplicity of illustration, they may be of different shapes, and their sides may be of different proportions than those illustrated. The edges of the housings may be rounded, angled, or otherwise formed differently from those illustrated.

One of the housings 10, 20 includes at least one resilient member rigidly attached to that housing, while the other of the housings 10, 20 includes a rigid member rigidly attached to that housing. In FIGS. 1A-1C, the first housing 10 includes a plurality of resilient members 14, and the second housing 20 includes a corresponding plurality of rigid members 24. FIG. 1A illustrates the housings 10, 20 prior to assembly of the enclosure. The housings 10, 20 are positioned relative to each other as shown, and then the housing 10 is "dropped" or placed onto the second housing 20 in the direction 2. FIG. 1B illustrates the position of the housings 10, 20 following the dropping or placement. In this position, the resilient members 14 and corresponding rigid members 24 are aligned with each other in preparation for the housings 10, 20 being slidably engaged in the direction 4. FIG. 1C illustrates the position of the housings 10, 20 when fully engaged to form the enclosure 1. Each resilient member 14 slidably engages the corresponding rigid member 24. Each rigid member 24 compresses the corresponding resilient member 14, and the compressed resilient members 14 generate a bias force that urges the first surface 12 and the second surface 22 towards each other in the direction 6. The structure and operation of various resilient members 14 and rigid members 24, and associated structures in the housings 10, 20 that urge the surfaces 12, 22 toward each other will be discussed subsequently with reference to FIGS. 2A-2B through 10A-10B.

It can be appreciated that, alternatively, instead of the first housing 10 dropping onto the second housing 20, the second housing 20 can be raised up onto the first housing 10 in the opposite direction of direction 2 or the positions of the housings 10, 20 can be swapped and the second housing 20 dropped or placed onto the first housing 10. It can also be appreciated that alternatively the second housing 20 can be slid relative to the first housing 10 in the opposite direction of direction 4.

In some examples, plural resilient members 14 are arranged in a substantially linear fashion along an axis 16 in the direction 4. For example, the first housing 10 has three resilient members 14 arranged along a first axis 16A parallel to the Y direction, and three along a second axis 16B parallel to the Y direction. These axes 16A,B may be adjacent and parallel to a plane of different sides 13 of the first housing 10.

The X-Y-Z coordinate system illustrated is defined for FIGS. 1A-1C. It can be appreciated that the dropping (or raising) of a housing 10, 20 occurs in the Z-direction, and that the relative sliding of the housings 10, 20 occurs in the Y-direction. This same coordinate system is used for the two-dimensional schematic cross-sectional views of FIGS. 2A-2B through 10A-10B, and the particular two dimensions illustrated in each figure are so indicated.

Figure 2A:
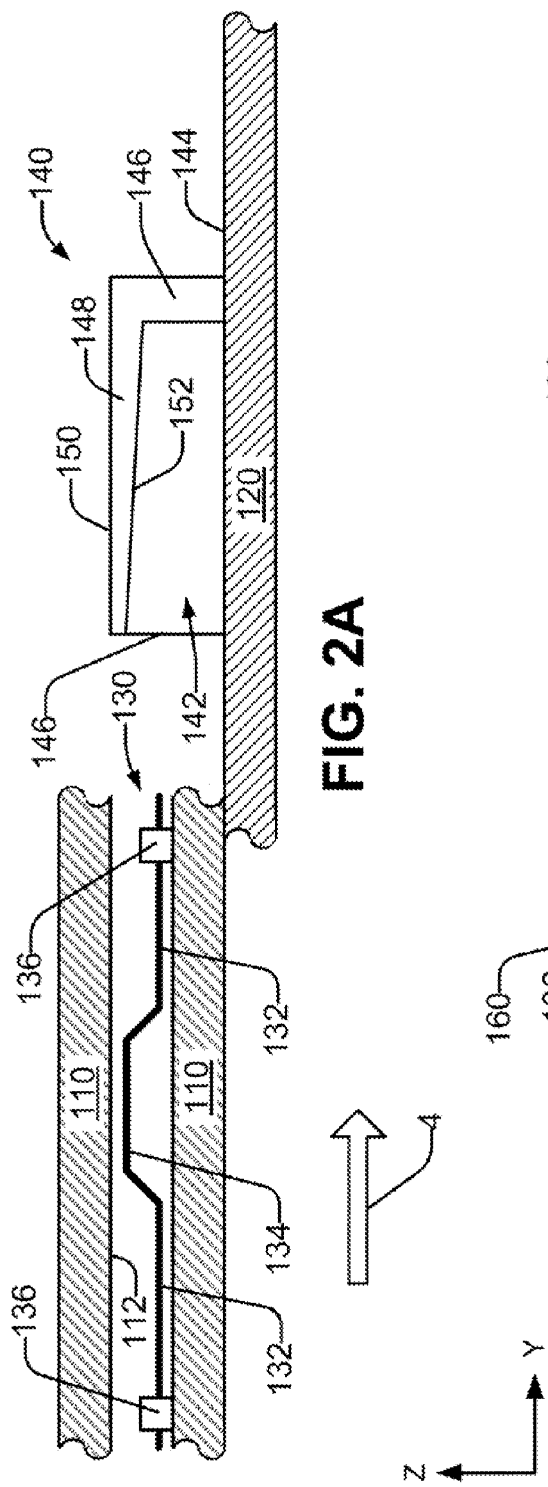
FIGS. 2A-2B are schematic cross-sectional side views of a first set of two housings of an enclosure prior to and after, respectively, slidable engagement of the housings in accordance with an example of the present disclosure.
Figure 2B:
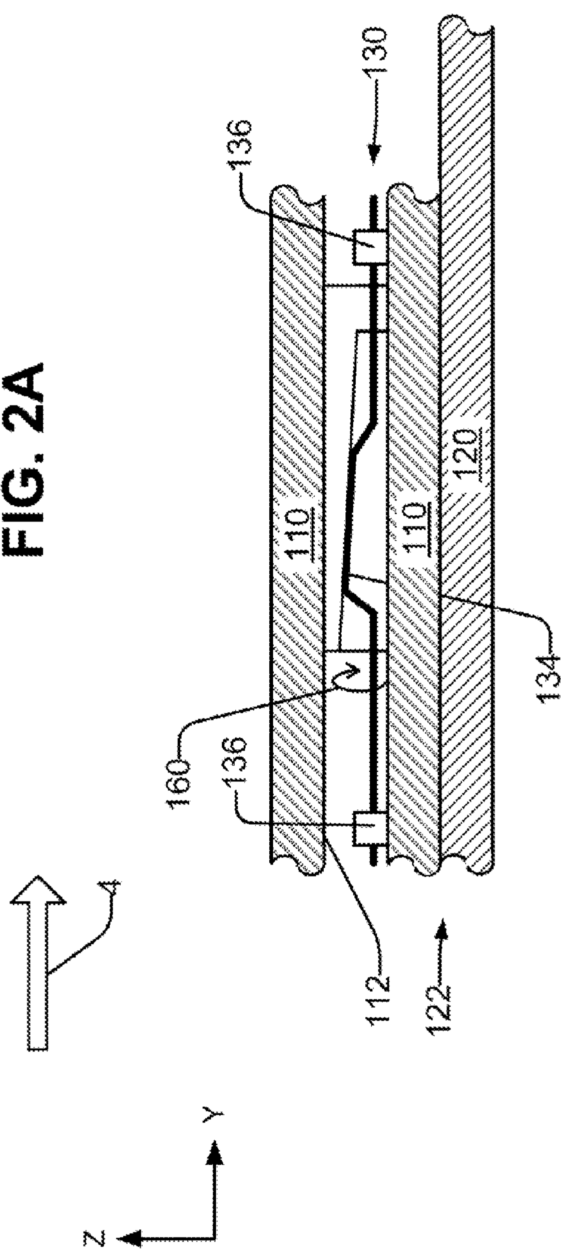
Figures 3A, 3B:
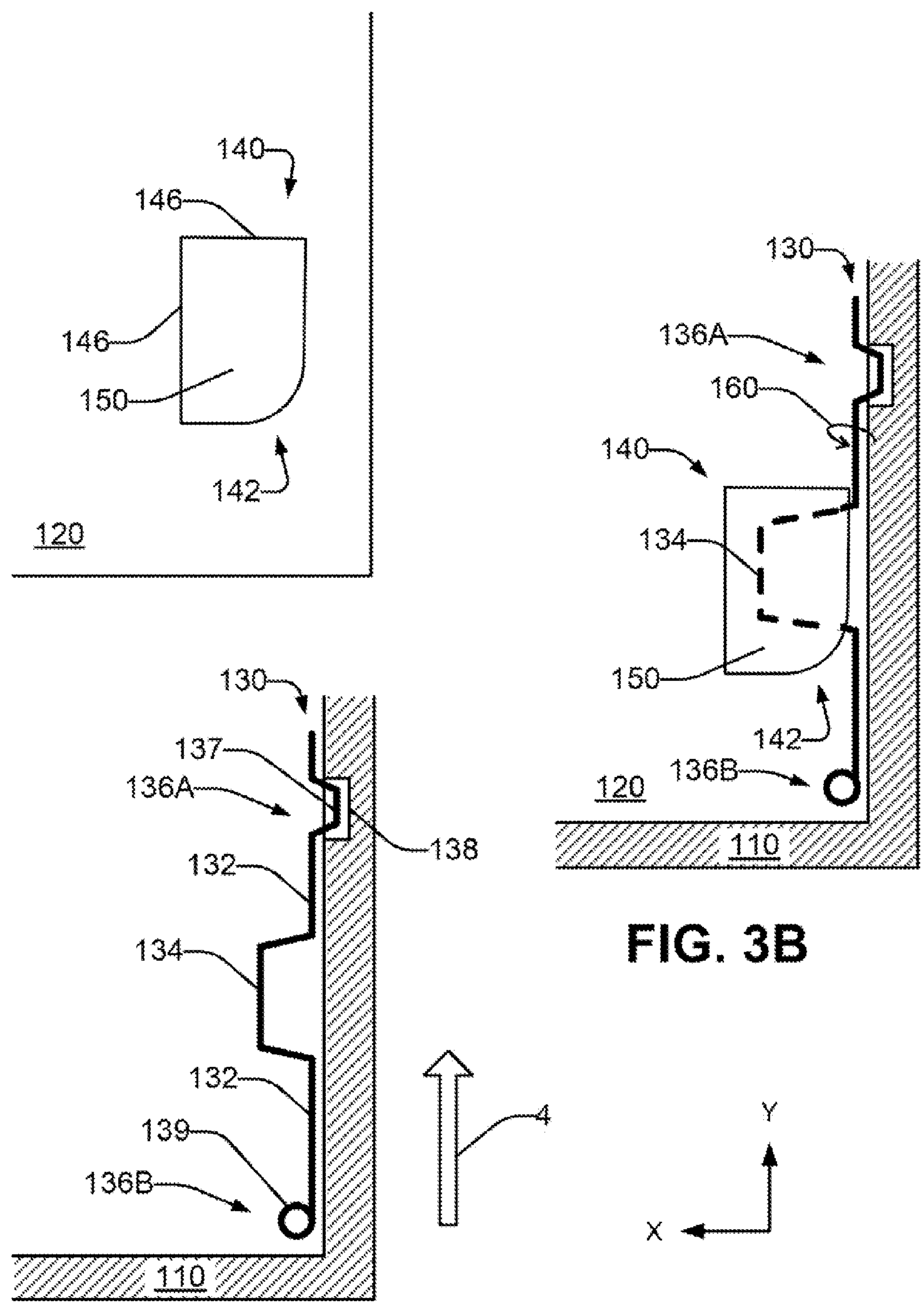
FIGS. 3A-3B are schematic cross-sectional top views of the first set of two housings of an enclosure prior to and after, respectively, slidable engagement of the housings in accordance with an example of the present disclosure.
Figure 4A:
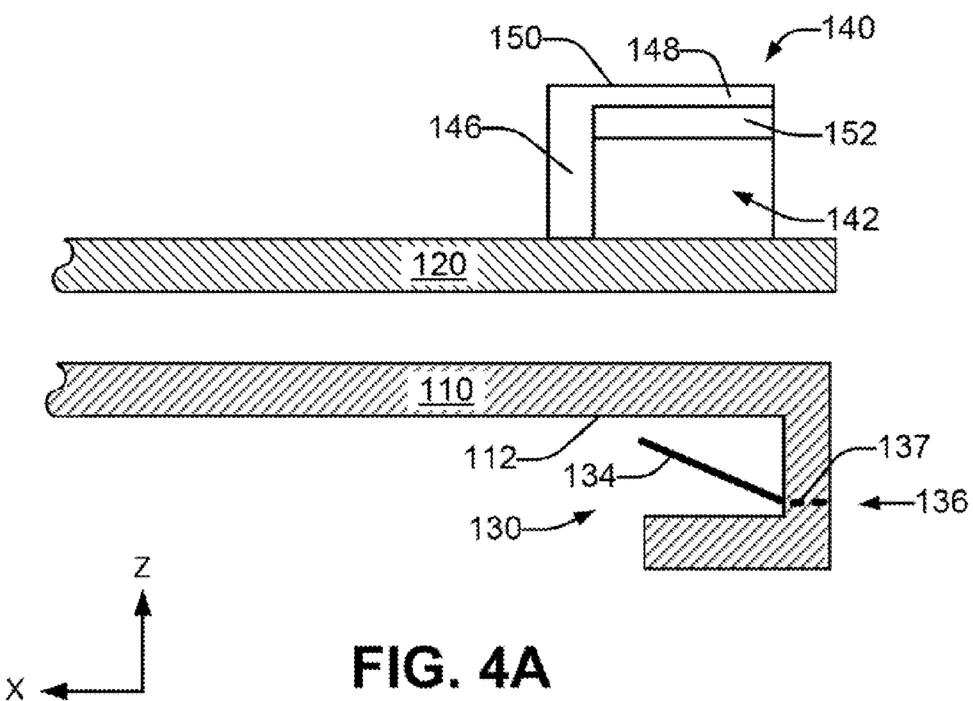
FIGS. 4A-4B are schematic cross-sectional front views of the first set of two housings of an enclosure prior to and after, respectively, slidable engagement of the housings in accordance with an example of the present disclosure.
Figure 4B:
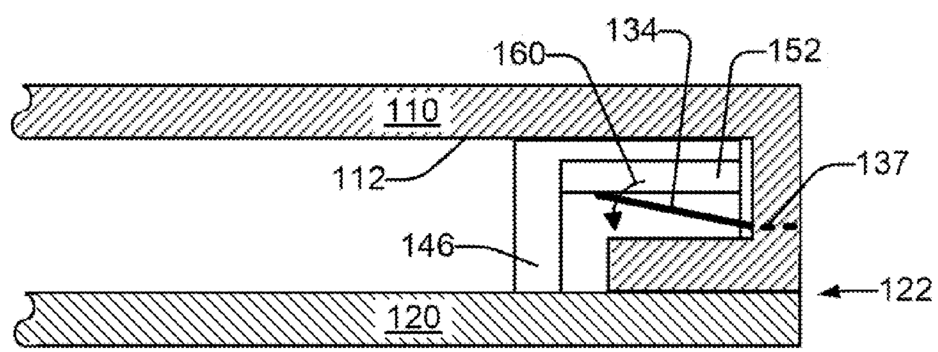

Considering now one example enclosure, and with reference to the schematic side, top, and front views of the unassembled housings of FIGS. 2A, 3A, and 4A, and the assembled housings of FIGS. 2B, 3B, and 4B, the enclosure includes a first housing 110 and a second housing 120. The first housing 110 includes at least one wireform 130, each wireform 130 having at least one linear segment 132 and at least one protrusion 134. As defined herein and in the appended claims, a "wireform" shall be broadly understood to mean a part typically made from round wire that is bent to have specific angles and lengths. The second housing 120 includes at least one pocket 140. Typically, each protrusion 134 is associated with a corresponding pocket 140.

The wireform 130 serves as one or more resilient members, such as for example resilient member 14 of FIGS. 1A-1C. One example wireform 130 may contain three protrusions 134, each protrusion 134 spaced apart, by a linear segment 132, from adjacent protrusions 134 at the appropriate distance to allow engagement with its corresponding pocket 140 when the housings 110, 120 are assembled. The wireform 130 is typically metallic. Steel is one suitable metal, among many others. A compliant elastomer could alternatively be used. The material should have sufficient strength and stiffness such that, when the housings 110, 120 are assembled, they are held together in the direction of the Z axis if the enclosure is flexed, twisted, or dropped.

A protrusion 134 may have a generally trapezoidal shape. A linear portion of the protrusion 134 that engages the pocket 140 extends generally parallel to at least one of the linear segments 132. The ramped side portions of the protrusion 134 ease entry of the protrusion 134 into the pocket 140 with a smooth motion during assembly. The wireform 130 typically has a circular cross-sectional shape, which also assists in easing entry of the protrusion 134 into the pocket 140 with a smooth motion during assembly.

The wireform 130 is attached to the first housing 110 at at least two attachment points 136 that limit or prevent movement, particularly rotation, of the wireform 130 at those points. A variety of attachment mechanisms may be used at different attachment points. In one example attachment mechanism at attachment point 136A, a retention slot 138 in the housing 110 receives a first attachment feature 137, in this case a protrusion, of the wireform 130. The slot 138 is sized to limit or prevent rotation of the feature 137 and thus of the wireform 130. In another example attachment mechanism at attachment point 1366, a second attachment feature 139, in this case a loop, of the wireform 130 is attached to the housing 110 by a fastener (not shown).

The wireform 130 may include a plurality of protrusions 134, each of which is positioned along the wireform 130 so as to engage with a corresponding pocket 140 when assembled. In one such configuration, an attachment point 136 is disposed between each pair of adjacent protrusions 134. This allows each protrusion 134 to have a different amount of compression. Another configuration may have attachment points 136 at the ends of the wireform 130 but not between at least some adjacent protrusions. Any suitable number and configuration of attachment points 136 may be chosen as appropriate for a particular enclosure design.

The pocket 140 is rigidly attached to the housing 120, and engages with a corresponding protrusion 134 when the housings 110, 120 are assembled. The pocket 140 has a cavity 142 which is structured and sized to receive the protrusion 134 in an interference fit. The interference fit causes the wireform 130 to be compressed along the Z axis when the housings 110, 120 are assembled.

The pocket 140 is rigidly attached to the second housing 120, and extends above an interior surface 144 of the housing 120 via walls 146. The pocket 140 has a cap portion 148 that is integral with, or attached to the walls 146, and spaced apart by the walls 146 from the interior surface 144 of the housing 120. A planar exterior surface of the cap 148 defines a Z datum surface 150 of the pocket 140. The cap 148 may have a rounded edge where the protrusion 134 contacts the pocket 140 in order to ease entry of the protrusion 134 into the pocket 140 with a smooth motion during assembly.

The pocket 140 also has an inner surface 152 which is at least partially ramped. The ramped inner surface 152 also eases entry of the protrusion 134 into the interference fit with the pocket 140 with a smooth motion during assembly. In addition, the ramped inner surface 152 facilitates the compression of the wireform 130.

In some examples, the pocket 140 may be casted or molded into the second housing 120. In other examples, the pocket 140 may be formed by a machining operation, with the size and shape of the pocket 140 selected so as to be compatible with the tools used to form it. One such operation is a CNC process. The machining operation may achieve smaller variances in the dimensionality of the pocket 140 than some other manufacturing techniques, and thus allow for tighter tolerances across a range of manufactured parts than some other manufacturing techniques.

To assemble the enclosure, the housings 110, 120 are slidably engaged along the Y axis to position the protrusion 134 within the pocket 140, as can be appreciated from the assembled enclosures of FIGS. 2B, 3B, and 4B. As the protrusion 134 begins to enter the pocket 140, the protrusion 134 smoothly engages the beginning of the ramped inner surface 152.

As the protrusion 134 moves further into the pocket 140, the ramp of the inner surface 152 progressively compresses the wireform along the Z axis by imparting rotation 160 to the wireform 140 in the region of the protrusion 134. The ramp causes the rotation 160 to be imparted smoothly over time as the protrusion 134 proceeds into its final position within the pocket 140, providing a known friction that eases assembly of the enclosure by the sliding motion of the housings 110, 120.

Because the wireform 130 is limited or prevented from rotating at the attachment points 136, torsion is applied to the wireform 130. This torsion, in turn, causes the protrusion 134 to provide a biasing force against the inner surface 152 that urges the Z datum surface 150 of the pocket 140 against a corresponding planar Z datum surface 112 of the housing 110. The first housing 110 includes a Z datum surface 112 to contact each corresponding pocket Z datum surface 150 of the second housing 120.

The first housing 110 includes a sufficient number of wireforms 130 and protrusions 134, and the second housing a corresponding number of pockets 140, to exert a sufficient amount of biasing force to hold the housings 110, 120 together along the Z axis. In regard to this biasing force, once the datum surface 150 of a pocket 140 contacts the datum surface 112, further relative movement of the housings 110, 120 in the Z axis direction is inhibited. As a result, additional movement of the protrusion 134 further into the pocket 140 along the ramp 152 in the direction 4 causes additional compression of and torsion in, the wireform 130, and a corresponding increase in the bias force exerted by the protrusion 134 against the ramp 152. This increased bias force increases, in turn, the bias force in the Z axis direction exerted by the datum surface 150 against the datum surface 112. In this manner, the housings 110, 120 will be held more firmly together. The areas of the Z datum surfaces 112, 150 are sufficiently large to distribute the biasing force evenly and stably within the enclosure.

It can be appreciated that when the housings 110, 120 are fully slidably engaged to form the enclosure, they are maintained together along the Z axis direction without the use of any fasteners applied to the enclosure in the Z axis direction. For example, no screws are applied to, or through, the housing 110, 120 surfaces whose planes are orthogonal to the Z axis direction in order to maintain the housings 110, 120 together.

It can also be appreciated that, in some examples, a surface of housing 110 may be brought into contact with a surface of housing 120 at position 122 as a result of the application of the biasing force. However, in other examples these two surfaces may not be brought into contact by the biasing force, as it is the contact between the Z datum surfaces 112, 150 that provide the structural integrity to the enclosure in the Z axis direction.

Figure 5A:
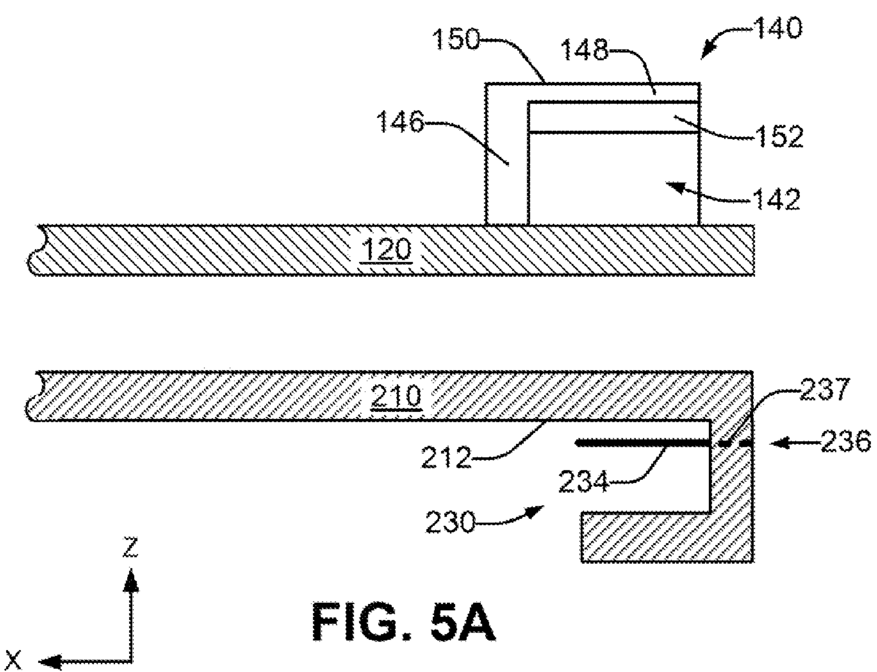
FIGS. 5A-5B are schematic cross-sectional front views of the second set of two housings of an enclosure prior to and after, respectively, slidable engagement of the housings in accordance with an example of the present disclosure.
Figure 5B:
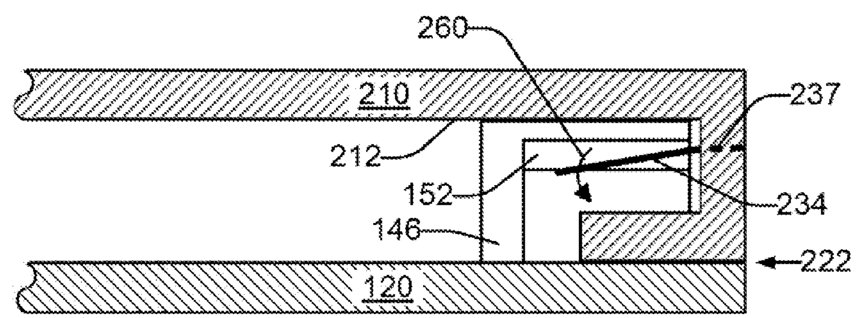

Considering now a second example enclosure, and with reference to the schematic front views of the unassembled housings of FIG. 5A, and the assembled housings of FIG. 5B, the enclosure includes a first housing 210 and a second housing 120. The first housing 210 is similar to the first housing 110 (FIGS. 4A-4B), but differs in the shape and attachment location of the wireform. In the housing 110, the attachment point 136 of the wireform 130 is at a position along the Z axis that is lower than the lowest part of the ramped inner surface 152 of the pocket 140. As a result, the protrusion 134 extends diagonally upward in order to contact the ramp 152 as the housings 110, 120 are slidably engaged. This results in a three-dimensional wireform in which the protrusion 134 and the attachment feature 137 are not in the same plane.

In the first housing 210 of FIGS. 5A-5B, the attachment point 236 of the wireform 230 is at a higher position along the Z axis than the attachment point 136. More specifically, the attachment point 236 is within the span of the ramp 152 along the Z axis. This allows the use of a wireform 230 which has a flat shape. In other words, all the protrusions 234, all the attachment features (including but not limited to feature 237), and all the linear segments (not shown) lie in substantially the same plane prior to assembly of the housings 210, 120. Such a wireform 130 may be considered as having at least a partially serpentine shape.

When the housings 210, 120 are slidably engaged along the Y axis to assemble the enclosure, the protrusion 234 contacts the ramped inner surface 152, and the protrusion 234 is rotated 260 as torsion is applied to the wireform 230. In a similar manner as has been explained heretofore, the torsion causes the protrusion 234 to provide a biasing force against the inner surface 152 that urges the Z datum surface 150 of the pocket 140 against a corresponding planar Z datum surface 212 of the housing 210. A surface of housing 210 may or may not be brought into contact with a surface of housing 120 at position 222 as a result of the application of the biasing force, also as has been explained heretofore.

Figures 6A, 6B:
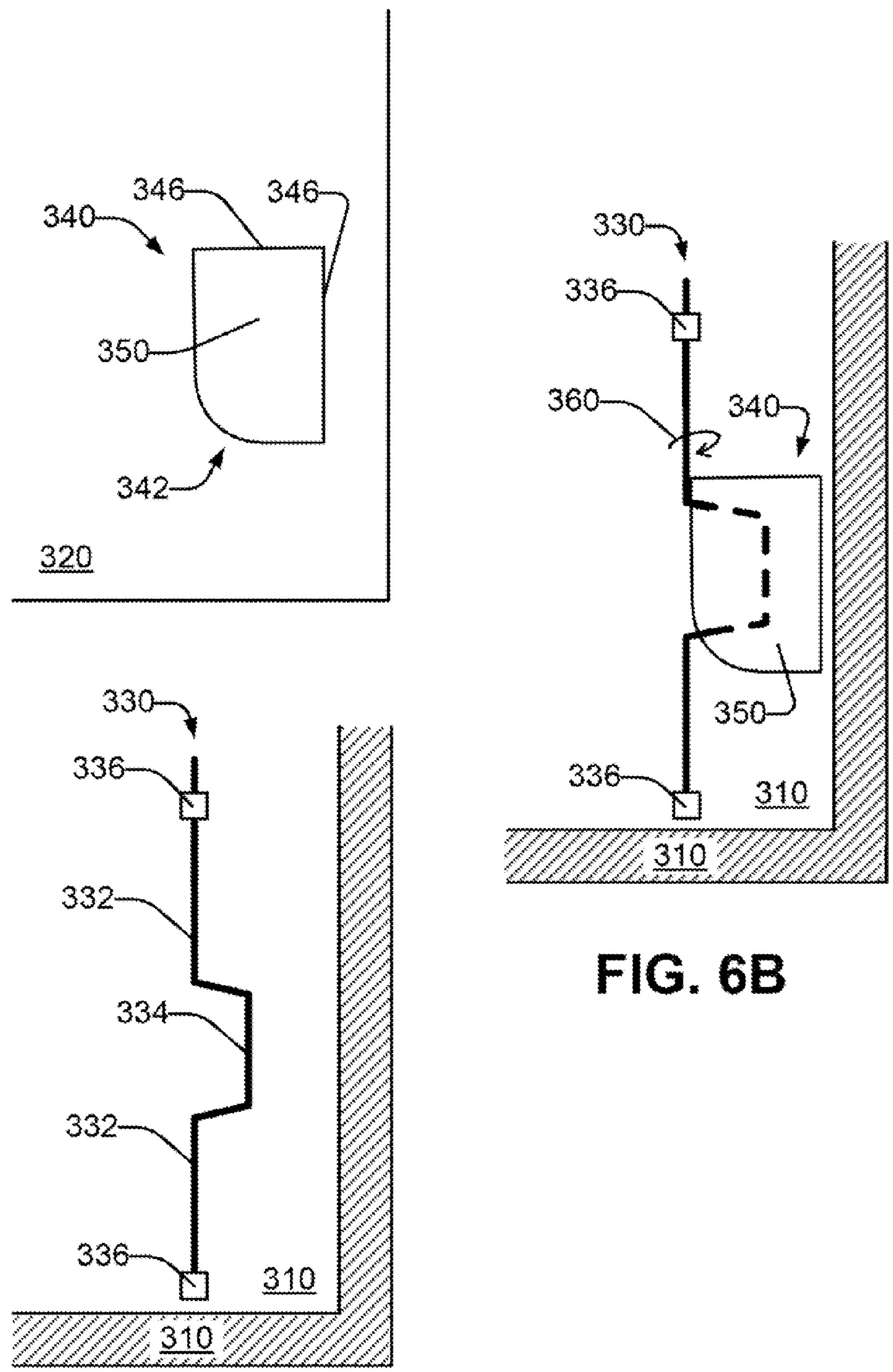
FIGS. 6A-6B are schematic cross-sectional side views of a third set of two housings of an enclosure prior to and after, respectively, slidable engagement of the housings in accordance with an example of the present disclosure.

Considering now a third example enclosure, and with reference to the schematic top views of the unassembled housings of FIG. 6A, and the assembled housings of FIG. 6B, the enclosure includes a first housing 310 and a second housing 320. The first housing 310 is similar to the first housing 110 (FIGS. 3A-3B), but differs in the orientation of the wireform and its attachment points. The second housing 320 is similar to the second housing 120 (FIGS. 3A-3B), but differs in the orientation of the pocket.

In the first housing 310, the protrusion 334 in the wireform 330 extends along the X axis in an outward direction toward the adjacent side of the housing 310. By comparison, in the first housing 110, the protrusion 134 extends along the X axis in an inward direction toward the interior of the housing 110.

In the second housing 320, the pocket 340 opens to the inside of the housing 320, in order to allow the wireform protrusion 334 to enter into the pocket 340. By comparison, in the second housing 120, the pocket 140 opens to the inside of the housing 120 in order to allow the wireform protrusion 134 to enter into the pocket 140.

The examples of FIGS. 1A-1C through 6A-6B have been discussed previously with regard to biasing, and thus urging, the housings together in the direction of the Z axis. Considering now a fourth example enclosure, and with reference to the schematic side views of the unassembled housings of FIG. 7A and the assembled housings of FIG. 7B, the housings 410, 420 are fastened or locked together in the direction of the Y axis. This fastening also locks the housings together in the direction of the Z axis.

The housing 410 is similar in many aspects to the housing 110 (FIGS. 2A-2B) discussed previously. However, the housing 410 additionally includes at least one anchor 470 disposed adjacent an edge of the housing 410 that extends in a direction along the X axis (i.e. in and out of the page of FIGS. 2A-2B)). Two anchors 470 are illustrated, but more or fewer anchors 470 may be included in the housing 410. Each anchor 470 is structured to receive and retain a fastener, such as example fastener 480. The anchor 470 and fastener 480 may be collectively considered to be cinching features of the enclosure.

The housing 420 is similar in many aspects to the housing 120 (FIGS. 2A-2B) discussed previously. However, the housing 420 additionally includes an end portion 425. In some examples, the end portion 425 may form at least a portion of a side of the enclosure when the housings 410, 420 are assembled.

In some examples, the fastener 480 may be applied through a void or orifice 475 in the end portion 425 and captured by the anchor 470. In other examples, the fastener 480 may be installed in, or an integral part of, the end portion 425. The fastener 480 may be a screw, a rivet, a nail, or the like. Screws are often advantageous because they allow for the appropriate amount of compressive force to be applied to the housings 410, 420 in the direction of the Y axis to hold the housings 410, 420 in the position of full slidable engagement in the Y direction and to prevent the housings 410, 420 from being separated from each other in the Y direction. Screws are also advantageous in that they can be removed for servicing components disposed in the interior of the enclosure, and these components can then be accessed by slidably disengaging the housings 410, 420, in the opposite direction of direction 4.

Because the housings are maintained in the position of full slidable engagement along the Y axis by the fasteners 480 and anchors 470, the wireform 130 is also maintained in its fully compressed position along the Z axis, in which the torsion in the wireform resulting from the compression exerts the bias force against the cap 448 of the pocket 440 that holds the datum surface 150 of the pocket 440 and the datum surface 112 of the housing 410 in contact with each other so as to prevent motion of the housings 410, 420 along the Z axis.

It can be appreciated that a number of alternatives to the anchors 470 and the fasteners 480 can be used to maintain the housings 410, 420 together in the direction of the Y axis. Some of these may be for example, magnets, or a friction fit between the housings 410, 420 to name but a few.

It can also be appreciated that the housings 410, 420 are locked together without any fasteners being applied in the Z axis direction. As a consequence, no fasteners are applied through the top or bottom surfaces of the housings 410, 420 (which correspond to the surfaces 12, 22 of FIGS. 1A-1C).

Another aspect in which the housing 420 and the cavity 442 differs from the housing 120 (FIGS. 2A-2B) is in the structure of the pocket 440 of the housing 420, as compared to the pocket 150 and cavity 142 of the housing 120. The pocket 440 has a cap portion 448 with an inner surface that has a ramped segment 462 and a non-ramped segment 464. The ramped segment 452 functions in a similar manner as the ramped inner surface 152 (FIGS. 2A-2B); to rotate the protrusion in direction 160, compress the wireform 130 along the Z axis, and impart torsion to the wireform 130, the torsion generating a bias force that urges the Z datum surface 150 of the housing 420 against the corresponding Z datum surface 112 of the housing 110 and in this way maintain the housings 410, 420 together in the Z axis direction. When the housings 410, 420 are fully slidably engaged, the protrusion 134 is in contact with the non-ramped surface 464. Since the plane of the surface 464 is substantially parallel to the wireform 130, all of the bias force provided by the wireform 130 is in the Z axis direction. As a result, there is no component of the bias force in the Y axis direction (in the opposite direction of direction 4) as occurs with the ramp 152 (FIG. 2B). As a result, the housings 410, 420 tend to remain in position in the Y axis direction once they are fully slidably engaged, without relying on the fasteners 480 to overcome a Y axis direction force component due to the compressed wireform 130.

Figure 7A:
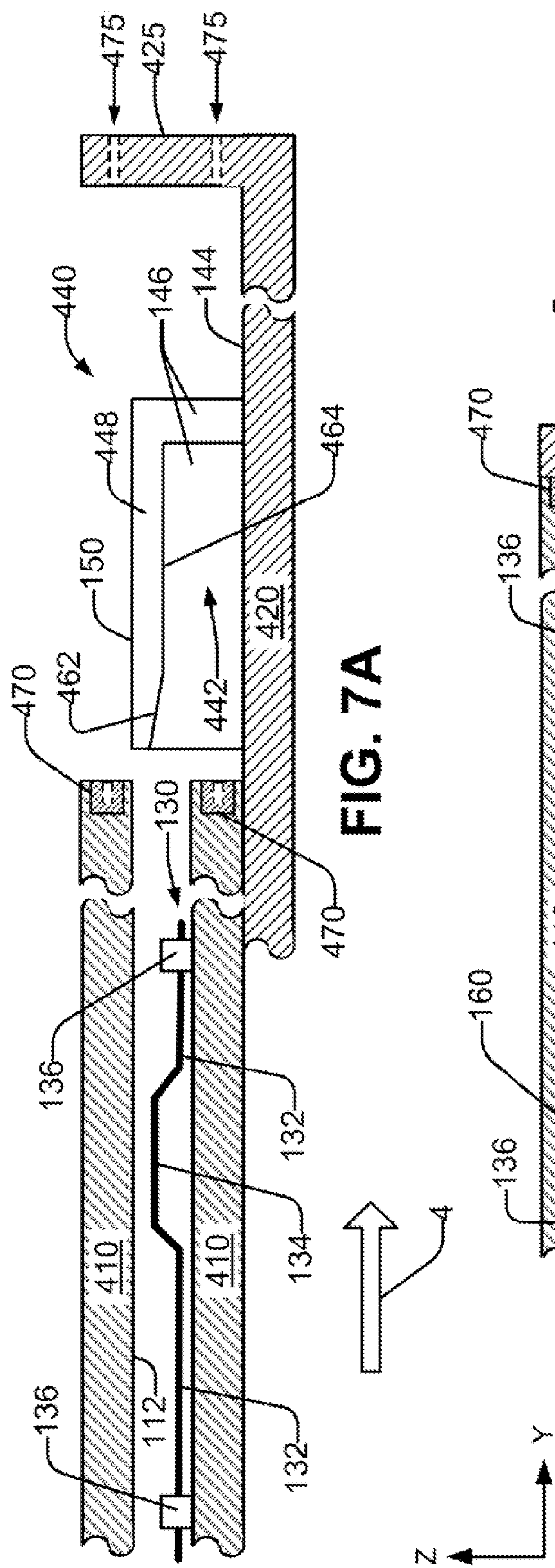
FIGS. 7A-7B are schematic cross-sectional side views of a fourth set of two housings of an enclosure prior to and after, respectively, slidable engagement and cinching of the housings in accordance with an example of the present disclosure.
Figure 7B:
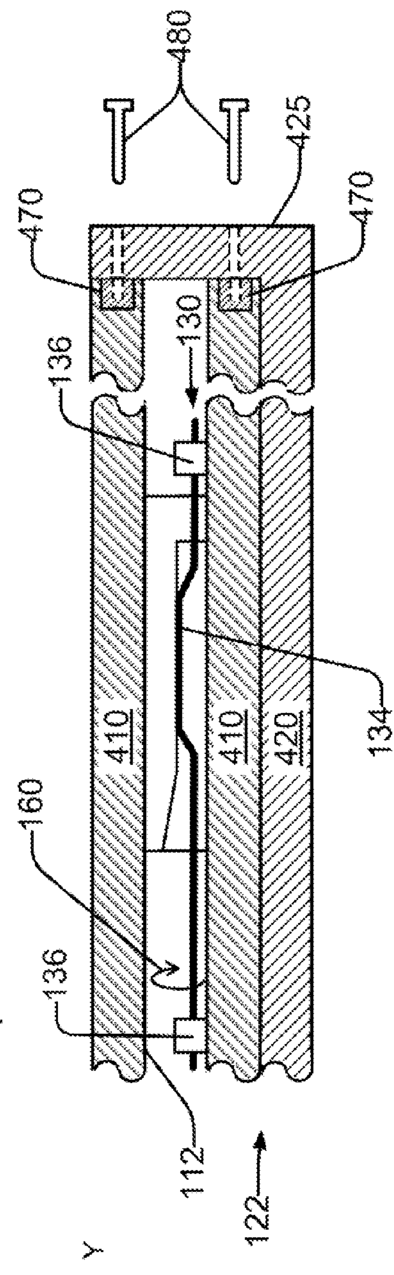

The examples of FIGS. 7A-7B have been discussed previously with regard to locking the housings of the enclosure together in the directions of the Z and Y axes. However, in some cases such an enclosure may still be susceptible to a shearing motion when, for example, two opposing sides of the enclosure are grabbed and twisted. This shearing motion can give the enclosure a less-solid feel that may be perceived by a user as "cheaper" than an enclosure which is not susceptible to the shearing motion and thus feels more-solid.

Considering now a fifth example enclosure, and with reference to the schematic top and front views of the unassembled housings of FIGS. 8A-9A and the assembled housings of FIG. 8B-9B, anti-shearing features in the housings 510, 520 mate so as to inhibit, limit, or prevent movement of the housings in the direction of the X axis when the housings are fully slidably engaged.

Figure 8A:
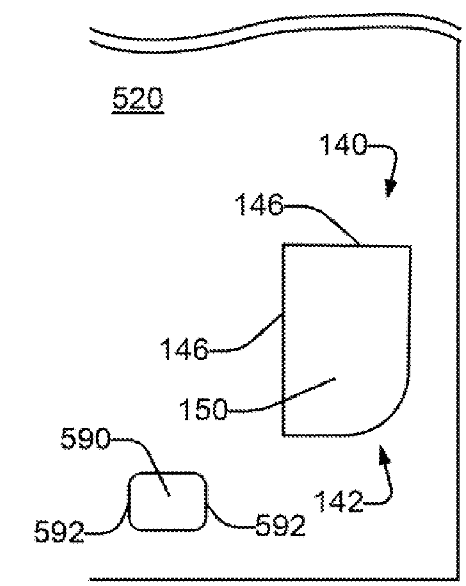
FIGS. 8A-8B are schematic cross-sectional top views of a fifth set of two housings of an enclosure prior to and after, respectively, slidable engagement of the housings and anti-shear features, and cinching of the housings, in accordance with an example of the present disclosure.
Figure 8A:
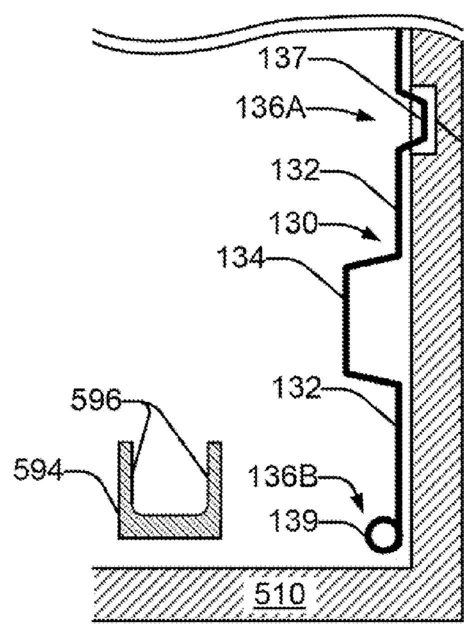
Figure 8B:
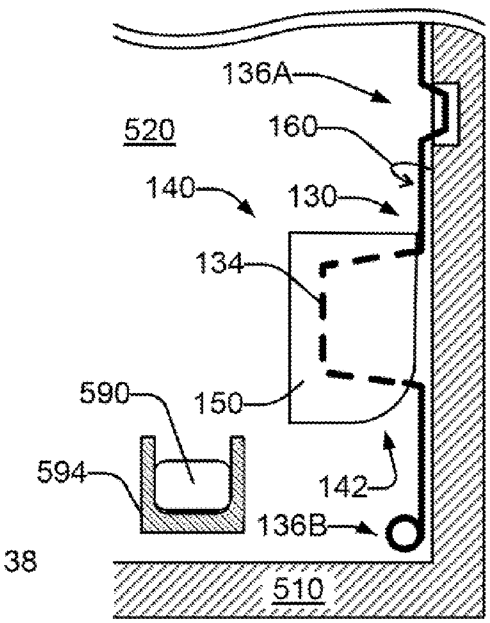
Figure 9A:
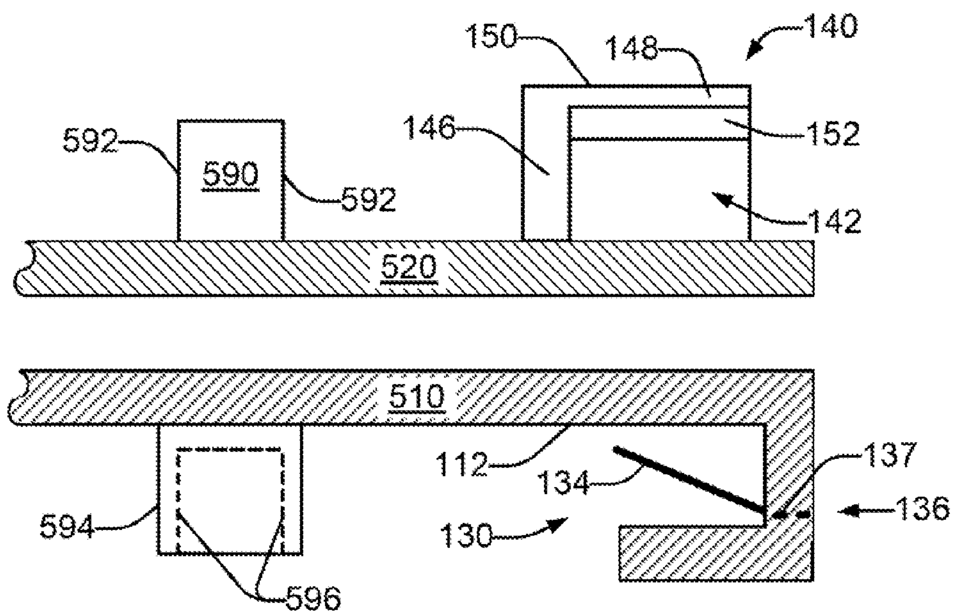
FIGS. 9A-9B are schematic cross-sectional front views of a sixth set of two housings of an enclosure prior to and after, respectively, slidable engagement of the housings and anti-shear features in accordance with an example of the present disclosure.
Figure 9B:
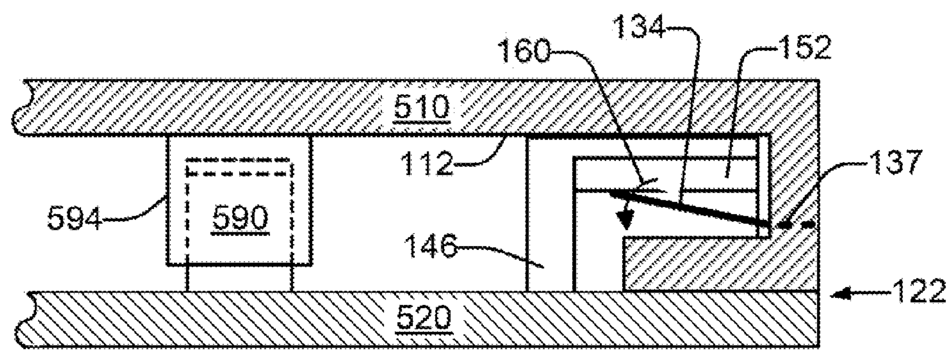

The anti-shearing features include a projection 590 attached to one of the housings, and a receptacle 594 attached to another of the housings. Typically the projection 590 and receptacle 594 are rigid structures, and they are rigidly attached to the housings. As illustrated in FIGS. 8A and 9A, the projection 590 is attached to the housing 520 while the receptacle 594 is attached to the housing 510, but they can be reversed in a different example.

The projection 590 includes two planar sides 592 that are parallel to the direction 4 (i.e. to the Y axis). The planar sides 592 may be rounded at the corners where the projection 590 engages the receptacle 594, in order to align the projection 590 and the receptacle 594 along the X axis and ease entry of the projection 590 into the receptacle 594.

The receptacle 594 includes two planar walls 596 that form a cavity or void in the receptacle 594 that is sized to receive the projection 590. The walls 596 provide minimal clearance for the planar sides 592 when the projection 590 and the receptacle 594 are mated. This clearance is large enough to allow for the projection 590 and the receptacle 594 to be mated, but small enough so that, when the housings 510, 520 are fully slidably engaged along the Y axis, movement of the housings 510, 520 along the X axis is limited or prevented.

While a single projection 590 and single receptacle 594 are illustrated in a specific position, it can be appreciated that plural pairs of projections 590 and receptacles 594 may be used and disposed at any locations in the housings 510, 520 which limit or prevent movement of the housings 510, 520 along the X axis.

In other examples, the projection 590 and the receptacle 594 may have different shapes, as long as the projection 590 and the receptacle 594 mate when the housings 510, 520 are fully slidably engaged and limit or prevent relative motion of the housings 510, 520 in the direction of the X axis.

It can be appreciated that, while for simplicity of illustration the Y axis locking components (end portion 425, and anchor 470, and fasteners 480) are not shown in FIGS. 8A-8B and 9A-9B, these components are also included in the housings 510, 520. As a result, the housings 510, 520 are locked together to limit or prevent movement in all three of the X, Y, and Z directions when assembled, resulting in an enclosure with high structural integrity and shear-resistance that feels "solid" to the user.

It can also be appreciated that, while the housing 520 of FIGS. 8A-8B and 9A-9B includes the pocket 140, the housing 520 could alternatively include the pocket 440

(FIGS. 7A-7B). As another alternative, the housing 510 could alternatively include the wireform 330 (FIGS. 6A-6B) instead of the wireform 130, and the housing 520 could alternatively include the pocket 340 (FIGS. 6A-6B) instead of the pocket 140.

Figure 10:
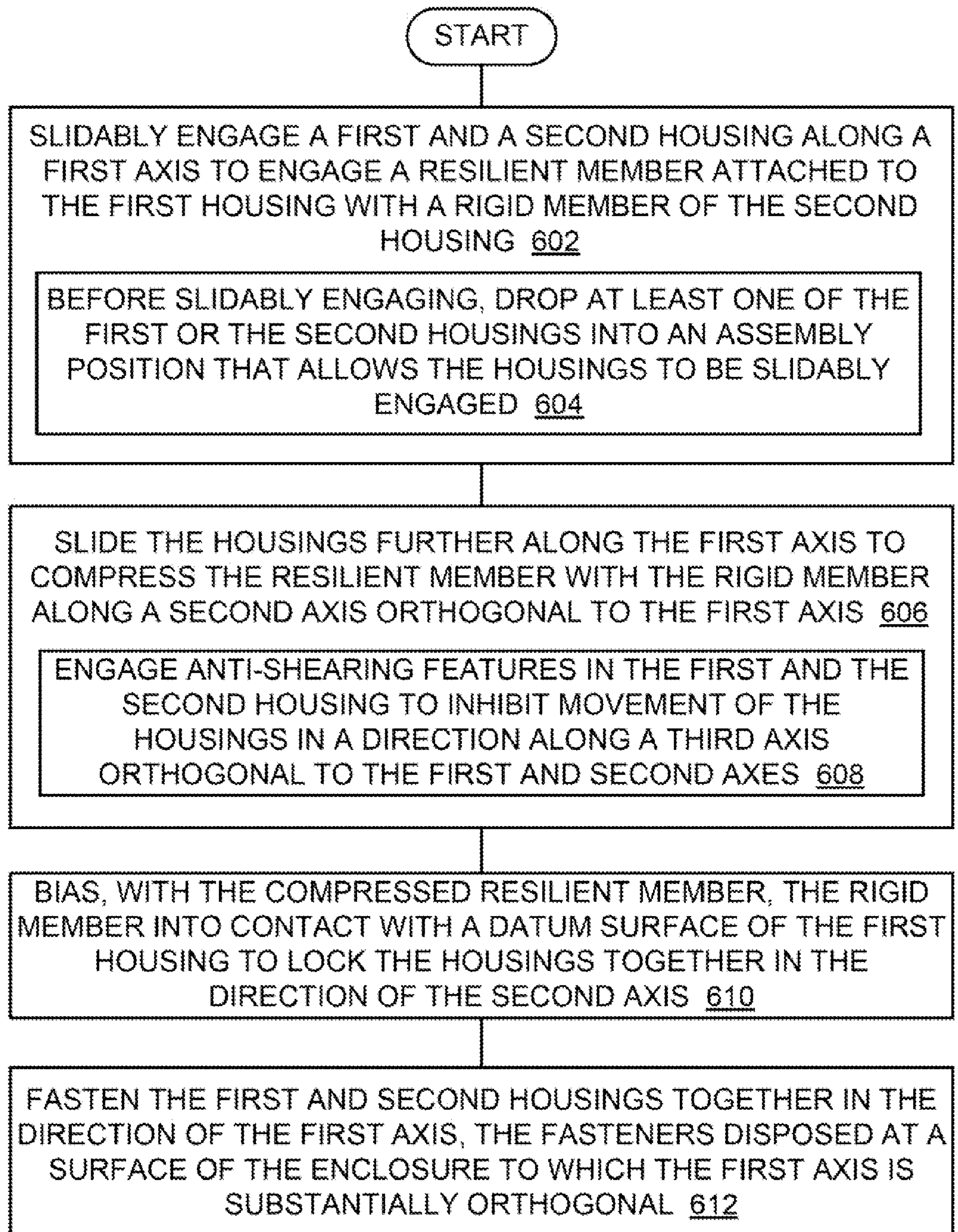
FIG. 10 is a flowchart in accordance with an example of the present disclosure of a method of assembling an enclosure.

Considering now a method of assembling an enclosure, and with reference to FIG. 10, a method 600 begins at 602 by slidably engaging a first and a second housing along a first axis to engage a resilient member attached to the first housing with a rigid member of the second housing. In some examples, at 604, at least one of the first or the second housings is dropped into an assembly position that allows the housings to be slidably engaged.

At 606, the housings are slid further along the first axis to compress the resilient member with the rigid member along a second axis orthogonal to the first axis. In some examples, at 608, anti-shearing features in the first and the second housing are engaged with each other to inhibit, limit, or prevent movement of the housings in a direction along a third axis orthogonal to the first and second axes.

At 610, the rigid member is biased, by the compressed resilient member, into contact with a datum surface of the first housing so as to lock the housings together in the direction of the second axis.

At 612, the first and second housings are fastened together in the direction of the first axis, the fasteners disposed at a surface of the enclosure to which the first axis is substantially orthogonal. In some examples, fasteners are applied in the direction of the first axis, but no fasteners are applied in the direction of the second axis.

From the foregoing it will be appreciated that the enclosure, enclosure attachment system, and method provided by the present disclosure represent a significant advance in the art. Although several specific examples have been described and illustrated, the disclosure is not limited to the specific methods, forms, or arrangements of parts so described and illustrated. Terms of orientation and relative position (such as "top," "bottom," "side," and the like) are not intended to require a particular orientation of any element or assembly, and are used only for convenience of illustration and description. This description should be understood to include all novel and non-obvious combinations of elements described herein, and claims may be presented in this or a later application to any novel and non-obvious combination of these elements. The foregoing examples are illustrative, and no single feature or element is essential to all possible combinations that may be claimed in this or a later application. As defined herein and in the appended claims, the term "having" shall be broadly understood to mean "comprising". Unless otherwise specified, steps of a method claim need not be performed in the order specified. Similarly, blocks in diagrams or numbers (such as (1), (2), etc.) should not be construed as steps that must proceed in a particular order. Additional blocks/steps may be added, some blocks/steps removed, or the order of the blocks/steps altered and still be within the scope of the disclosed examples. Further, methods or steps discussed within different figures can be added to or exchanged with methods or steps in other figures. Further yet, specific numerical data values (such as specific quantities, numbers, categories, etc.) or other specific information should be interpreted as illustrative for discussing the examples. Such specific information is not provided to limit examples. The disclosure is not limited to the above-described implementations, but instead is defined by the appended claims in light of their full scope of equivalents. Where the claims recite "a" or "a first" element of the equivalent thereof, such claims should be understood to include incorporation of one or more such elements, neither requiring nor excluding two or more such elements.

What is claimed is:

1. An electronic product enclosure, comprising:

a first housing having a first surface;

a second housing having a second surface and structured to slidably engage the first housing along a first axis such that the first and second surfaces form spaced-apart opposing sides of the enclosure;

a resilient member rigidly attached to the first housing inside the enclosure, the resilient member being a wireform attached to the first housing, the wireform having a linear base portion rigidly attached to the first housing, and having a protrusion offset from the linear base portion; and a rigid member attached to the second housing inside the enclosure, the rigid member being a pocket in the second housing, the second housing having a second, opposing surface of the enclosure, the pocket sized to receive the protrusion and structured to compress the resilient member so as to urge the first and second surfaces toward each other when the housings are slidably engaged.

2. The enclosure of claim 1, comprising:

a first datum surface rigidly attached to the first housing; and a second datum surface rigidly attached to the second housing and parallel to the first datum surface, wherein the compressed resilient member biases the first and second datum surfaces into contact.

3. The enclosure of claim 1, comprising:

cinching features in the first and second housings structured to be fastenable together to maintain the housings in the slidably engaged position so as to lock the housings together along the first axis and maintain the first and second surfaces in the position at which they are urged by the compressed resilient member.

4. The enclosure of claim 1, wherein the first housing and the second housing are locked together without fasteners applied in the direction of the urging.

5. The enclosure of claim 1, comprising:

anti-shearing features in the first and second housing structured such that, when engaged, the features prevent movement of the housings along an axis perpendicular to the first axis and in the plane of at least one of the surfaces.

6. An enclosure attachment system, comprising:

a wireform attached to a first housing having a first surface of an enclosure, the wireform having a linear base portion rigidly attached to the first housing parallel to an edge of the first housing that defines a first axis;

a protrusion in the wireform offset from the linear portion;

a pocket in a second housing, the second housing having a second, opposing surface of the enclosure, the pocket sized to receive the protrusion;

a ramped interior surface in the pocket structured to slidably engage the protrusion and impart torsion to the wireform when the first and second housings are slidably engaged along the first axis.

7. The enclosure attachment system of claim 6, wherein the torsion urges the housings together in a direction orthogonal to the first axis.

8. The enclosure attachment system of claim 6, wherein:

the pocket comprises a pocket datum surface on the exterior of the pocket within the enclosure;

the first housing comprises a housing datum surface within the enclosure, and the pocket datum surface and the housing datum surface are disposed within the enclosure such that the datum surfaces are urged into contact by the wireform torsion when the first and second housings are slidably engaged along the first axis.

9. The enclosure attachment system of claim 7, comprising:

an orifice in one of the first or the second housings sized to receive a fastener, the orifice disposed other than in the first surface; and an anchor in the other of the first or the second housings sized to receive the fastener from an inside edge of the one housing and lock the housings together along the first axis and the orthogonal axis, the anchor disposed in other than the second surface.

10. The enclosure attachment system of claim 6, comprising:

a rigid projection attached to one of the first or the second housings having two planar sides parallel to the first axis; and a rigid receptacle attached to the other of the first or the second housings to receive the projection, the receptacle having two planar walls positionable against the two planar sides when the first and second housings are slidably engaged along the first axis to prevent movement of the housings along an axis orthogonal to the first axis.

11. The enclosure attachment system of claim 6, wherein the protrusion comprises:

a linear engagement portion parallel to the base portion; and a ramped segment connecting the engagement portion and the base portion, the ramped segment structured for smooth engagement with the ramped interior surface in the pocket.

12. A method of assembling an enclosure, comprising:

slidably engaging a first and a second housing along a first axis to engage a resilient member attached to the first housing with a rigid member of the second housing;

sliding the housings further along the first axis to compress the resilient member with the rigid member along a second axis orthogonal to the first axis; and biasing, with the compressed resilient member, the rigid member against a datum surface of the first housing to urge the housings together in the direction of the second axis, wherein:

the resilient member being a wireform attached to the first housing, the wireform having a linear base portion rigidly attached to the first housing, and having a protrusion offset from the linear base portion, and the rigid member being a pocket in the second housing, the second housing having a second, opposing surface of the enclosure, the pocket sized to receive the protrusion.

13. The method of claim 12, comprising:

after the biasing, fastening the first and second housings together in the direction of the first axis, fasteners disposed at a surface of the enclosure to which the first axis is substantially orthogonal.

14. The method of claim 12, comprising:

during the further sliding, engaging anti-shearing features in the first and the second housing to lock the housings in a direction together along a third axis orthogonal to the first and second axes.

15. The method of claim 12, comprising:

dropping at least one of the first or the second housings into an assembly position that allows the housings to be slidably engaged along the first axis.

* * * * *

UNITED STATES PATENT AND TRADEMARK OFFICE

CERTIFICATE OF CORRECTION

PATENT NO. : 9,578,757 B2
APPLICATION NO. : 14/786313
DATED : February 21, 2017
INVENTOR(S) : Steven Kamins Jacobs It is certified that error appears in the above-identified patent and that said Letters Patent is hereby corrected as shown below:

In the Drawings

In sheet 10 of 10, reference numeral 608, Line 4, delete "AXES" and insert -- AXIS --, therefor.

Signed and Sealed this
Twenty-third Day of May, 2017

Michelle K. Lee
*Director of the United States Patent and Trademark Office*